United States Patent
Weigen

(10) Patent No.: US 8,049,155 B2
(45) Date of Patent: Nov. 1, 2011

(54) PROCESSING METHOD AND APPARATUS FOR ENERGY SAVING OF AN ACTIVE INFRARED INDUCTION INSTRUMENT POWERED BY A DRY BATTERY

(75) Inventor: Chen Weigen, Shanghai (CN)

(73) Assignee: Shanghai Kohler Electronics, Ltd., Shanghai (CN)

( * ) Notice: Subject to any disclaimer, the term of this patent is extended or adjusted under 35 U.S.C. 154(b) by 446 days.

(21) Appl. No.: 12/297,474

(22) PCT Filed: Apr. 19, 2007

(86) PCT No.: PCT/IB2007/001020
§ 371 (c)(1),
(2), (4) Date: Feb. 20, 2009

(87) PCT Pub. No.: WO2007/122475
PCT Pub. Date: Nov. 1, 2007

(65) Prior Publication Data
US 2009/0309639 A1    Dec. 17, 2009

(30) Foreign Application Priority Data
Apr. 20, 2006   (CN) .......................... 2006 1 0025857

(51) Int. Cl.
*H01J 40/14*    (2006.01)
*H01L 27/00*    (2006.01)
*G01J 5/00*    (2006.01)
*H04N 3/14*    (2006.01)
*H03K 3/017*    (2006.01)

(52) U.S. Cl. .............. 250/214 R; 250/208.1; 250/338.1; 348/307; 327/172

(58) Field of Classification Search .............. 250/214 R, 250/214.1, 216, 214 SW, 214 LS, 208.1, 250/338.1, 339.06; 348/307, 308, 309; 327/172, 327/416, 536
See application file for complete search history.

(56) References Cited

U.S. PATENT DOCUMENTS

| | | | |
|---|---|---|---|
| 3,842,346 A * | 10/1974 | Bobbitt | 324/522 |
| 5,224,685 A | 7/1993 | Chiang et al. | |
| 5,338,979 A * | 8/1994 | Mammano et al. | 326/30 |
| 5,566,702 A | 10/1996 | Philipp | |
| 5,963,135 A | 10/1999 | Van Marcke | |
| 6,161,814 A | 12/2000 | Jahrling | |
| 6,215,116 B1 | 4/2001 | Van Marcke | |
| 6,710,346 B2 | 3/2004 | Brewington et al. | |
| 6,919,567 B2 | 7/2005 | Iwasawa | |

FOREIGN PATENT DOCUMENTS

| | | |
|---|---|---|
| CN | 2569452 | 8/2003 |
| CN | 1862249 A | 11/2006 |
| GB | 2 355 523 A | 4/2001 |

OTHER PUBLICATIONS

International Search Report: PCT/IB2007/001020.
The Examination Report issued by the Intellectual Property Office of New Zealand Apr. 30, 2010, Patent Application No. 572025, 2 pages.

* cited by examiner

*Primary Examiner* — Georgia Epps
*Assistant Examiner* — Don Williams
(74) *Attorney, Agent, or Firm* — Foley & Lardner LLP

(57) ABSTRACT

An active infrared induction instrument powered by a dry battery capable of reducing power consumption through the adjustment of the emitter pulse width. The infrared emitting LED emits infrared signals, which, after being reflected by an object, are received by the infrared photodiode. The infrared signals received by the infrared photodiode then enter an integrated circuit chip through a comparator. The pulse widths of the infrared emission pulse signals are dynamically adjusted after the width of the pulse series is received by the discrimination chip, thus reducing the emission power consumption to save energy.

6 Claims, 4 Drawing Sheets

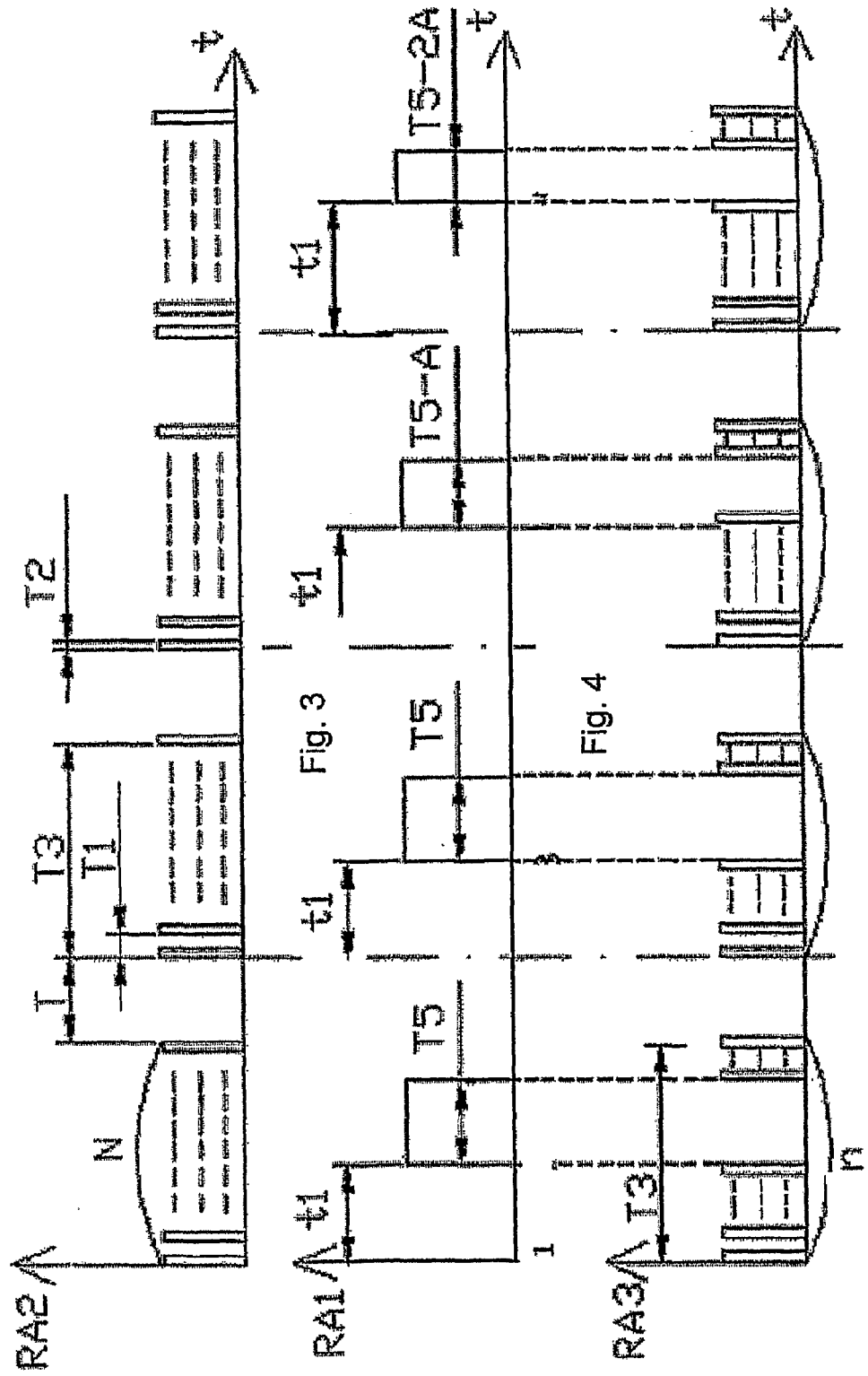

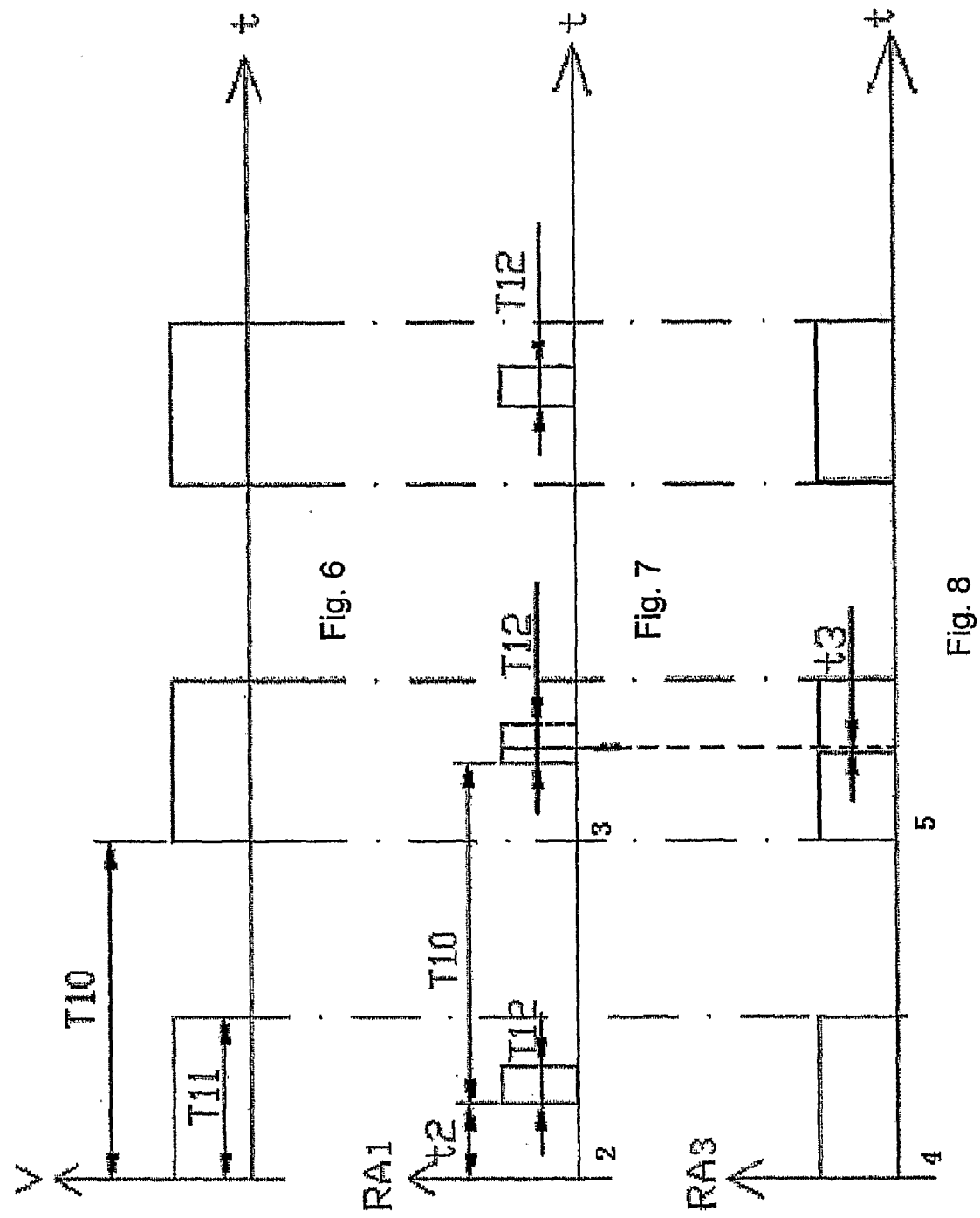

PROCESSING METHOD AND APPARATUS FOR ENERGY SAVING OF AN ACTIVE INFRARED INDUCTION INSTRUMENT POWERED BY A DRY BATTERY

TECHNICAL FIELD

The control of active infrared induction powered by a dry battery.

BACKGROUND TECHNOLOGY

The active infrared induction approach is a pick-off approach, which through eradiation and reflection of selective infrared rays, distinguishes and controls after processing reflected signals. As the sensor of the infrared induction is powered by dry battery, the power consumption of this product becomes important. In order to extend the working life of the dry battery, it is essential to reduce the power consumption. The existing technology uses accurate calculations and modeling of each component of the hardware circuit, as well as the periodic hibernation function in the standby mode of software, to realize its power requirements.

However, the existing technology fails to adjust the infrared emission energy automatically during the active working phase, when the infrared emitting LED consumes a large ratio of the power consumption. Adjustments to the pulse amplitude and frequency have been implemented to also address power issues, but the duration of the pulses have not been previously addressed to adjust the power consumption of the infrared emitting LED. Further, multiple components are utilized and often implement multiple scanning rates and multiple sensors to compare transmitted and received pulses. Such a system requires more components and more complicated software for regulation. Even utilizing this method, the pulse width is not adjusted which is an area that is ripe for optimization to utilize power and lower power consumption especially when using a dry battery.

INVENTION CONTENT

It is the intention of at least an embodiment of the present invention to be based on the optimization of the hardware circuit and the use of the dormancy of the software. It is an approach to reduce the power consumption by dynamically adjusting the pulse width of the infrared emission through distinguishing and processing the strength of the infrared receiving signal on the basis of use reliability. It is the intention of at least an embodiment of the present invention to be used to adjust the pulse width of the infrared emission through distinguishing the strength of the infrared receiving signal. During this process, the distinguishing of the strength of the receiving signal is realized by software enactment after a large number of experiments.

SUMMARY OF THE INVENTION

It is the intention of at least a preferred embodiment of the present invention to provide an electrical circuit having an emitting diode, infrared receiver and an integrated circuit ("IC"). The circuit preferably has a transistor connected between the emitting diode and one input of the IC. The circuit preferably has an operational amplifier and a comparator located between the infrared receiver and the IC. The comparator outputs to a transistor which outputs to two inputs of the IC. Based on the strength of the received signal by the infrared receiver, the IC can adjust the pulse width of the emitting diode dependent on the type of IC used.

If an interrupting IC is used, the IC will use a real-time approach to adjust the pulse width. Whereas, if a non-interrupting IC is used, the IC will use a time-lag approach to adjust the pulse width. This approach allows the IC to dynamically adjust the pulse width during its active phase allowing for the lowering of battery consumption.

BRIEF DESCRIPTION OF THE DRAWINGS

Drawing

Drawing

Drawing FIG. 3 is a time sequence diagram of the pulse emitted from RA2 when the circuit (1) of the output signal of the comparator (A2) of FIG. 1 is composed as in FIG. 2.

Drawing FIG. 4 is a time sequence diagram of the pulse emitted from RA1 when the circuit (1) of the output signal of the comparator (A2) of FIG. 1 is composed as in FIG. 2.

Drawing FIG. 5 is a time sequence diagram of the pulse emitted from RA3 when the circuit (1) of the output signal of the comparator (A2) of FIG. 1 is composed as in FIG. 2.

Drawing FIG. 6 is an operational amplifier reference level time sequence diagram of the circuit (1) of the output signal of the comparator in FIG. 2 when it is composed of one wire.

Drawing FIG. 7 is a time sequence diagram of the pulse emitted from RA1 when the circuit (1) of the output signal of the comparator (A2) in FIG. 2 is composed of one wire.

Drawing FIG. 8 is a time sequence diagram of the pulse emitted from RA2 when the circuit (1) of the output signal of the comparator (A2) in FIG. 2 is composed of one wire.

Drawing

Figure 1:
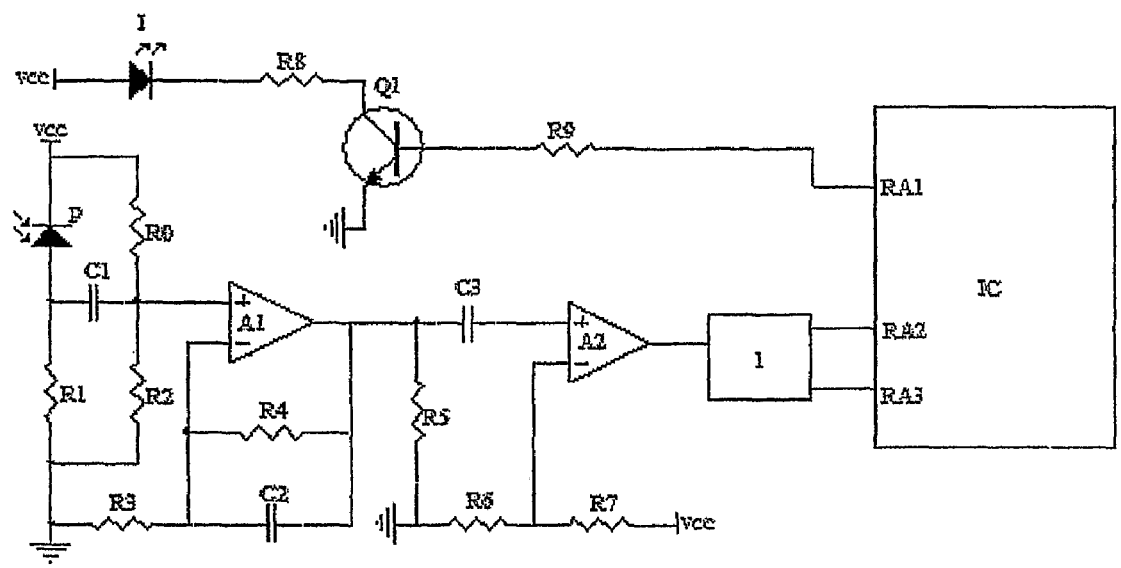
FIG. 1 is a schematic diagram of the hardware of the infrared emission-receiving process.

In the drawings, (I) emitting diode; (P) infrared receiver; (R8) resistor; (Q1) NPN Transistor; (R9) resistor; (RA1) input one of IC; (RA2) input 2 of IC; (RA3) input three of IC; (R0) resistor; (R1) resistor; (C1) capacitor; (R2) resistor; (R3) resistor; (R4) resistor; (C2) capacitor; (A1) operational amplifier; (C3) capacitor; (R5) resistor; (R6) resistor; (A2) comparator; (A7) resistor; (1) circuit containing (R10) resistor; (Q2) PNP transistor; (R11) resistor; (n) pulses collected; (T10) pulse signal period; (T11) pulsed signal width; (T12) pulse width; (N) number of pulses; (T1) pulse period; (T2) pulse width; (T3) total of T1 and T2; (T) interval time between two groups; (T5) pulse width of RA1 output

DETAILED DESCRIPTION OF THE PREFERRED EMBODIMENTS

The present invention can be realized in two embodiments.

Figure 2:
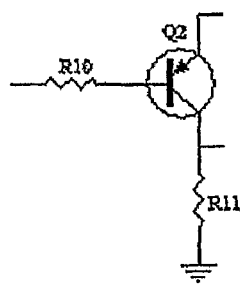
FIG. 2 is a partial plan of the circuit (1) of FIG. 1.

The present invention can adjust the pulse width of the infrared emission by distinguishing the strength of the infrared receiving signal through a continuous section of pulse series. The schematic for the circuit hardware is illustrated in FIG. 1. The circuit 1 for detection and identification of signals is illustrated in FIG. 2. In FIG. 3, after the power-on initialization, input 2 RA2 of the CSM IC outputs a pulse series composed of N pulses with a period T1 and a pulse width T2. The total time of this group of pulse series is T3, as in FIG. 3. The interval time between every two groups is T. T1 seconds after RA2 outputs the first pulse, input 1 RA1 will output a pulse signal whose period is (T+T2+T3) and pulse whose pulse width is T5. The NPN transistor Q1 will be turned on and drive the emitting diode I. The infrared receiver P receives the infrared ray and transforms it into an electrical signal. The electrical signal passes through the filter circuit composed of resistance R1 and capacitance C1, and the operational amplifier reference level circuit composed of resistor R0 and R2 in turn, and is inputted to the positive input of the operational amplifier A1. The signal then passes through a negative feedback loop composed of resistors R3 and R4 and capacitor C3 and is inputted into the positive input of the comparator A2. After the signal is compared with a reference voltage of the comparator at the negative input, a divider circuit that is composed of resistors R6 and R7 supplies the reference voltage; the signal is output to the base of the PNP transistor Q2. When the base level of the transistor Q2 is lower than the emitter level of the transistor Q2, the transistor Q2 is turned on and input 3 of the CSM IC RA3 collects pulse signals of the collector of the count unit Q1. The number of pulses collected here is recorded as n. When the base level of the transistor Q2 is higher than the emitter level of the transistor Q2, the transistor Q2 is cut off and RA3 collects no pulse signals.

Figure 9:
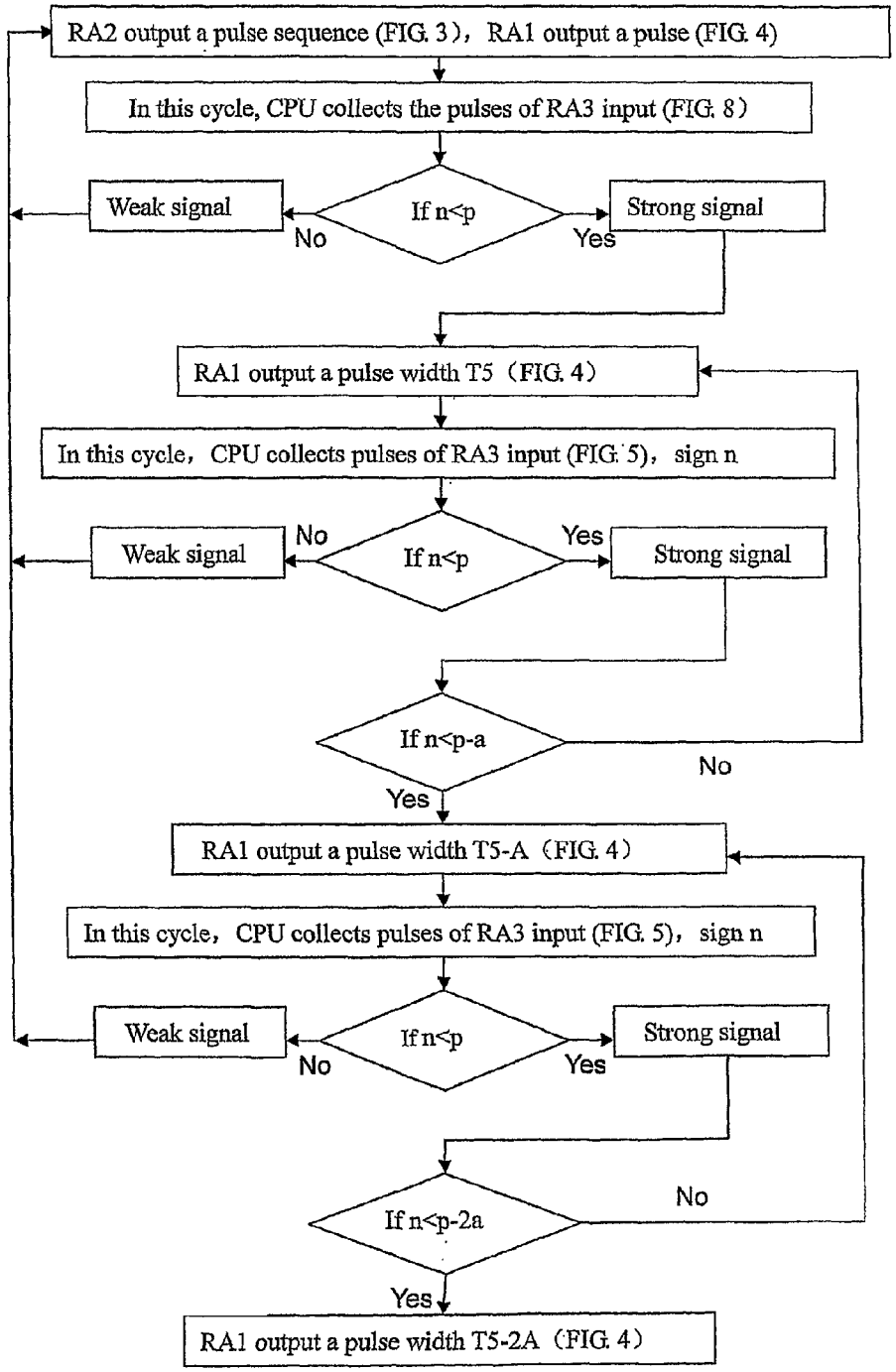
FIG. 9 is about two process cycles of the circuit (1) of the output signal of the comparator (A2) in FIG. 1 when circuit (1) is composed as in FIG. 2.

After collection, the pulse signal is judged by software on the IC. The symbols, p, A, a are the data gathered after a large number of pulse collections (experiments). p is the originally set comparative number of the pulses. A is the RA1 pulse width which decreases correspondingly in the SCM IC. a is the set number of the pulses that are decreasing progressively. The process uses the number of the pulses collected (n) to judge the strength of the received signals. When n>p, the signal is weak and the number of pulses will be recollected. When n≦p, the signal is strong. The specific judging steps are illustrated in FIG. 9, which displays about two cycles. The rest of the cycles suppose the number of pulse signals at the input of RA3 is n. The number of collected pulses (n) is used to judge the strength of the received signals. If the signal is weak, the number of pulses will be recollected. If the signal is strong, n will be compared with (p−(m+1)a); if n<(p−(m+1) a), RA1 will minus A from the original emitting pulse width (T5−ma), and continue to collect the pulse of the RA3 input. The dynamic adjustment narrows the width of the emitting pulse in order to achieve the ideal energy-saving effect. If n≧(p−(m+1)a), the width of the pulse from RA1 will be (T5−ma) and the aforementioned circulation will continue. This method is a time-lag approach by distinguishing the fluctuation of the emitting level pulse. This method costs less than implementing an IC that possesses interrupting functionality. A method utilizing an interrupting IC is also disclosed.

The present invention may adjust the pulse width of the infrared emission in a real-time method by distinguishing the change of the receiving signals and causing the SCM IC to interrupt. The schematic for the circuit hardware is illustrated in FIG. 1. The circuit 1 of the output signal of the comparator A2 is composed of a wire connected to the third input RA3 of the IC. The second input RA2 floats. The operating principle is that after power-on initialization, as a reference level voltage (V) synchronous to the infrared receiver P (a pulse signal, whose period is T10 and pulse width T11, output from a pin of the SCM IC) is overlaid at the input end of the operational amplifier A1, the reference level is composed of a divider resistance R0 and R2 and its period and pulse width is T10 and T11. After a 2-second delay, RA1 of the SCM IC outputs a high level pulse, whose period is T10 and pulse width T12. At this moment, the NPN transistor Q1 is turned on, thus driving the emitting diode I. After the voltage signal transformed from the infrared ray received by the infrared receiver passes through the filter circuit composed of resistor R1 and capacitor C1, and the divider resistors R0 and R2, the voltage signal enters the positive input of the operational amplifier A1. The signal then passes through the negative feedback circuit composed of resistors R3 and R4 and capacitor C3 by the output of the operational amplifier A1. The signal then enters the positive input of the comparator A2. After the signal is compared to the negative input of A2, which composes the comparator A2 with resistors R6 and R7, the result of the comparison will be output to input RA3. The SCM IC will do a real-time judgment and process according to the change of the signal. If RA3 collects no rising-edge pulse in the T11 period, the signal is judged as weak, and RA1 outputs a wave as illustrated in No. 2 of FIG. 7. If RA3 collects a rising-edge pulse, as illustrated in No. 5 of FIG. 8, in the T11 period, the signal is judged as a strong one (it takes about t3 seconds to finish the process of judgment). The interruption by the SCM IC occurs according to the rising edge of the outside pulse signal detected and received by the SCM IC. The interruption immediately transforms the output of RA1 from high level to low level during this period as illustrated in No. 3 of FIG. 7. A new judgment on the change of RA3 signal will be made until RA1 resumes the level pulse during the next period. By interrupting this way, the width of the emitting pulse can be adjusted in a real-time method, so that the power consumption is reduced and the energy-saving effect is realized.

Although the processing methods of the aforementioned two approaches are different, they follow the same principle, which is to make use of the strength of the feedback signal to adjust the emitting pulse signal after distinguishing the level signal by software in order to save energy. This method reduces the power consumption of the complete machine and prolongs the working life of the dry battery by way of automatically adjusting the width of the infrared emitting pulse by software.

Although the present invention has been shown and described herein by way of preferred embodiments, it is understood that the invention may be modified without departing from the spirit and scope of the invention as defined in the following claims.

The invention claimed is:

1. A method of energy saving in an active infrared induction instrument comprising the steps of:
   evaluating a group of received signals from a photodiode;
   comparing the group of received signals with a reference voltage utilizing a comparator;
   supplying an output of the comparator to a transistor;
   cutting off the transistor and not collecting pulses if the base level of the transistor is higher than an emitter level of the transistor;
   turning on the transistor and collecting and recording pulses if the base level of the transistor is lower than an emitter level of the transistor;
   adjusting the pulse width of an infrared emitter via software on an integrated circuit chip dependent on whether a group of pulses collected is judged to be strong or weak if the integrated circuit chip does not posses interrupting functionality; and
   adjusting the pulse width of an infrared emitter via an interrupt if the integrated circuit chip contains interrupting functionality.

2. The method of claim 1, further comprising the step of decreasing the pulse width of an emitting pulse if the received signals are judged strong.

3. The method of claim 1, further comprising the step of decreasing the pulse width until the received signals are judged weak.

4. The method of claim 1, further comprising the step of judging a signal weak when an integrated circuit chip possessing interrupting functionality does not collect a rising-edge pulse.

5. The method of claim 1, further comprising the step of an integrated circuit chip possessing interrupting functionality sending an interrupt immediately transforming the output of the integrated circuit chip from a high level to a low level when a rising-edge pulse is collected.

6. The method of claim 5, further comprising the step of continuing to send interrupts until the output of the integrated circuit chip resumes a level pulse during the next period.

* * * * *